United States Patent [19]

Blanchard

[11] Patent Number: 4,914,058
[45] Date of Patent: Apr. 3, 1990

[54] GROOVED DMOS PROCESS WITH VARYING GATE DIELECTRIC THICKNESS

[75] Inventor: Richard A. Blanchard, Los Altos, Calif.

[73] Assignee: Siliconix Incorporated, Santa Clara, Calif.

[21] Appl. No.: 138,999

[22] Filed: Dec. 29, 1987

[51] Int. Cl.⁴ .............. H01L 21/283; H01L 21/22
[52] U.S. Cl. .................. 437/203; 437/79; 437/41; 437/913; 437/66; 148/DIG. 168; 148/DIG. 126; 148/DIG. 50; 357/23.4
[58] Field of Search .......... 437/203, 79, 41, 913, 437/44, 45, 38, 66, 239; 148/DIG. 167, DIG. 168, DIG. 50; 357/23.4

[56] References Cited

U.S. PATENT DOCUMENTS

| | | | |
|---|---|---|---|
| 3,412,297 | 11/1968 | Amlinger | 148/DIG. 168 |
| 3,518,509 | 6/1970 | Cullis | 357/23.4 |
| 4,520,552 | 6/1985 | Arnould et al. | 437/2.3 |
| 4,546,367 | 10/1985 | Schutten et al. | 357/23.4 |
| 4,553,151 | 11/1985 | Schutten et al. | 357/23.4 |
| 4,622,569 | 11/1986 | Lade et al. | 357/23.4 |

FOREIGN PATENT DOCUMENTS

| | | |
|---|---|---|
| 0142189 | 12/1978 | Japan . |
| 0149771 | 12/1978 | Japan . |
| 0099583 | 8/1979 | Japan . |
| 0065463 | 5/1980 | Japan . |
| 0095366 | 7/1980 | Japan . |
| 0003287 | 1/1983 | Japan . |
| 0164265 | 9/1983 | Japan . |
| 0175725 | 4/1984 | Japan . |
| 0226185 | 11/1985 | Japan . |

OTHER PUBLICATIONS

Ueda et al., *IEEE Trasactions on Electron Devices*, vol. ED-32, No. 1, Jan. 1983, pp. 2-6.
Amar et al., *IEEE Transactions on Electron Devices*, vol. ED-27, No. 5, May 1980, pp. 907-914.
Sze, *VLSI Technology*, 1983, McGrawHill, pp. 145-149.

Primary Examiner—Brian E. Hearn
Assistant Examiner—T. N. Quach
Attorney, Agent, or Firm—Skjerven, Morrill, MacPherson, Franklin & Friel

[57] ABSTRACT

Disclosed is a process for making a DMOS, including lining a groove with a dielectric material to form an inner groove having sidewalls extending through the bottom of the first groove, and lining the inner groove with a dielectric material to obtain increased thickness of the gate dielectric on the sidewalls of the inner groove.

9 Claims, 8 Drawing Sheets

GROOVED DMOS PROCESS WITH VARYING GATE DIELECTRIC THICKNESS

BACKGROUND OF THE INVENTION

1. Field of the Invention

This invention relates to a double diffused MOS (DMOS) transistor having a vertical channel region, and in particular to a planar DMOS transistor having a vertical gate, and two thicknesses of dielectric in the vertical gate groove.

2. Description of the Prior Art

Figure 1:
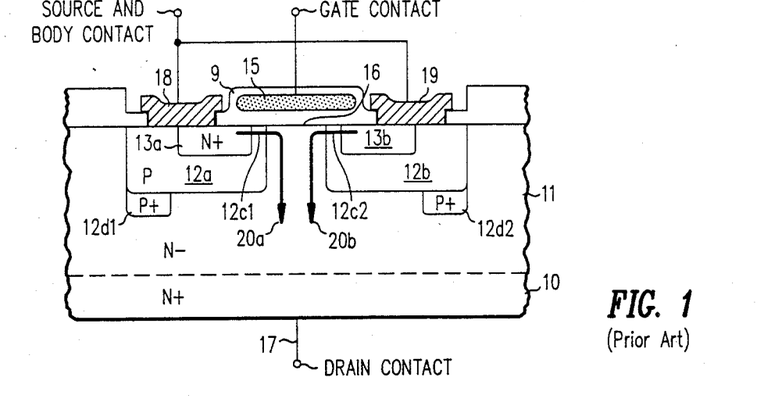
FIG. 1 shows a prior art N channel DMOS transistor.

Double diffused MOS (DMOS) transistors are well known in the prior art. For example, U.S. Pat. No. 4,344,081, issued to Pao et al. on Aug. 10, 1982, which is incorporated herein by reference, shows one such prior art structure. FIG. 1 shows a cross section of a prior art N-channel DMOS power transistor. This prior art structure includes an N−epitaxial layer 11 formed on an N+silicon substrate 10. Gate oxide layer 16 is formed on epitaxial layer 11 and doped polysilicon gate 15 is formed on layer 16. Oxide layer 9 covers gate 15. P type body regions 12a and 12b and P+ type deep body regions 12d1 and 12d2 are diffused into epitaxial layer 11, and N+source regions 13a and 13b are diffused into body regions 12a and 12b, respectively. Source regions 13a and 13b are electrically tied to body regions 12a and 12b by metal contacts 18 and 19, respectively. Contacts 18 and 19 are also electrically tied together Regions 12c1 and 12c2 beneath gate 15 in body regions 12a and 12b, respectively, are channel regions. When the potential between gate 15 and source regions 13a and 13b is sufficiently high and with a positive voltage on drain contact 17, carriers flow laterally from source regions 13a and 13b through channel regions 12c1 and 12c2, respectively, to drain region 11 and then vertically downward through drain region 11 and N+substrate 20 to drain contact 17, as indicated by arrows 20a and 20b in FIG. 1. P channel DMOS transistors have a similar structure, but P type and N type regionS are reversed, and a voltage of the opposite sign produces current flow.

Figure 2:
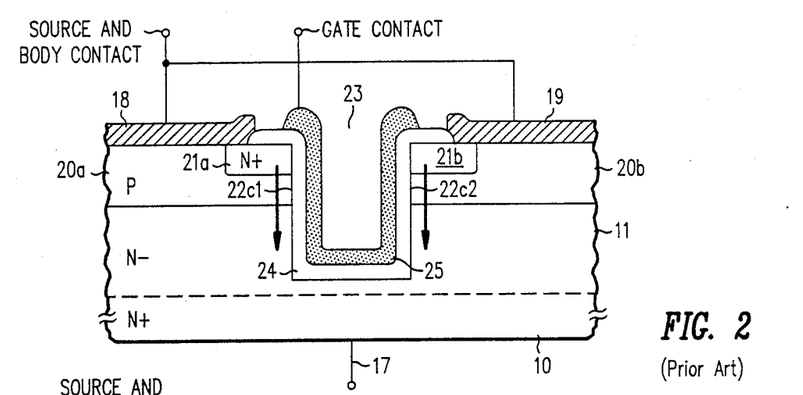
FIG. 2 shows a prior art DMOS transistor having vertical channel regions.

As explained above, the carriers that flow in the prior art vertical DMOS transistors shown in FIG. 1 must change direction, first flowing laterally and then vertically. Carrier flow is more efficient if the source, body and drain regions are arranged vertically as shown in FIG. 2. FIG. 2 shows a cross section of a prior art DMOS transistor with a U shaped gate extending into the epitaxial layer. This structure is due to Ueda et al. and is explained in more detail in *A New Vertical Power MOSFET Structure with Extremely Reduced On-Resistance*, IEEE TRANSACTIONS ON ELECTRON DEVICES, VOL. ED-32, NO. 1, January 1985, which is incorporated herein by reference. In this prior art structure N−epitaxial layer 11 is again formed on N+substrate 10. A P type dopant is diffused into epitaxial layer 11 and an N+type dopant is diffused into a portion of the epitaxial layer that has been doped with a P type dopant. Rectangular groove 23, having vertical walls, is then etched in the epitaxial layer using reactive ion beam etching, thereby creating P type body regions 20a and 20b and corresponding N+source region 21a and 21b as shown in FIG. 2. Source regions 21a and 21b are electrically tied to body regions 20a and 20b, respectively, by metal contacts 18 and 19 which are also electrically tied together. A slight wet etch is then applied to smooth the surface of groove 23. Gate oxide 24 is formed in rectangular groove 23, and a U shaped polysilicon gate 25 is formed over gate oxide 24.

The prior art structure of FIG. 2 has the advantage that when the gate to source potential is sufficient to turn on the transistor, carriers flow vertically from N+source regions 21a and 21b through channel regions 22c1 and 22c2 in body regions 20a and 20b, respectively, and continue to flow vertically downward through drain region 11 to N+substrate 10 and drain contact 17. However, the structure of FIG. 2 has a disadvantage in that it is difficult to fabricate because it requires the formation of a U-shaped gate and results in a transistor with a nonplanar surface.

SUMMARY OF THE INVENTION

A DMOS device is disclosed which has a vertical gate and a planar surface. The device has a flat surface for all masking steps while still allowing contact to be made to the vertical gate.

In one embodiment, a DMOS power transistor is disclosed which has a drain region of a first conductivity type, a body region of a second conductivity type formed above the drain region, and a source region of first conductivity type. An upward opening groove rectangular in cross section extends downward through the source and body regions and into the drain region so that a first source region in a first body region lies on one side of the rectangular groove and a second source region in a second body region lies on the other side of the rectangular groove.

The upward opening rectangular groove is lined with an upward opening dielectric region which is filled with the gate region so that a vertical gate is formed having a top surface which lies between the first and second source regions. An insulating layer is then formed over the above structure so that a transistor with a planar surface is obtained. In operation, carriers flow vertically between the source and drain regions.

In another embodiment, a semiconductor device having a vertical gate region is formed in a block of semiconductor material. The vertical gate region lies in an upward opening dielectric region which lines an upward opening rectangular groove. A source region of first conductivity type is formed above a body region of a second conductivity type which lies above a drain region of a first conductivity type. The source, body and drain regions are all adjacent one vertical surface of the dielectric material. The top surface of the vertical gate region lies opposite the source region and the bottom surface of the gate region lies opposite the drain region. The second embodiment also includes an insulating layer formed over the gate, source and body regions resulting in a device with a planar top surface. Still other embodiments are described below.

Patent Application 06/929,685, now abandoned assigned to the assignee of this invention, discloses a similar planar vertical channel DMOS transistor structure. The present invention provides a significant improvement over the other one in that the gate dielectric has two distinct thicknesses. This improvement provides higher device gain and higher breakdown voltage than does the other invention.

DESCRIPTION OF THE DRAWINGS BRIEF

FIG. 9a shows a top view of one surface geometry employed by the present invention while

DETAILED DESCRIPTION OF THE INVENTION

Figure 10:
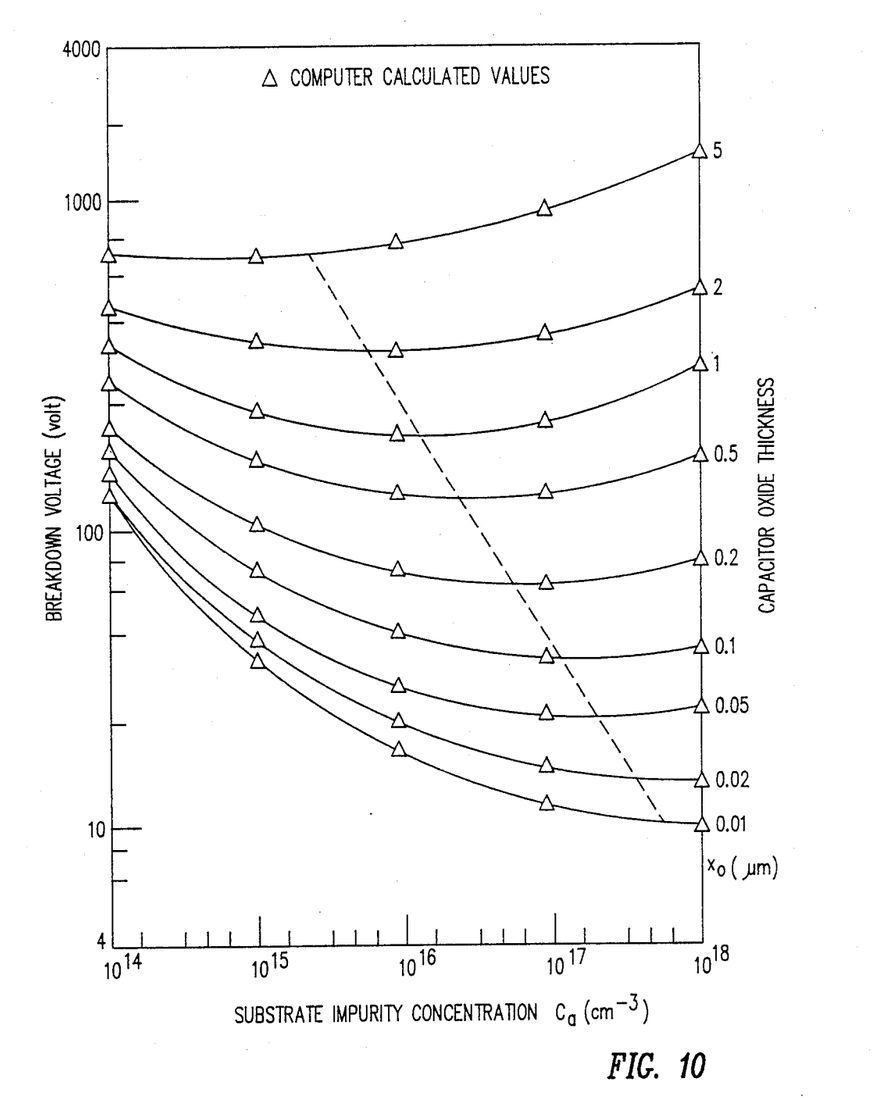
FIG. 10 shows the relationship between gate oxide thickness and breakdown voltage in a substrate.

The Patent Application "A Planar, Vertical Channel DMOS Structure", 06/929,685 (cited above), describes the fabrication of a dense, vertical channel power MOS transistor with a uniform gate dielectric thickness. The maximum drain-to-source operating voltage of this previously described device may be limited by the thickness and composition of the gate dielectric if the vertical groove reaches through to the underlying substrate. This device operating limit, often called "field plate induced breakdown", may be improved with the device structure shown in FIG. 3. In this figure, a groove is formed in the silicon, providing a vertical path for current flow. (The voltage on the gate conductor which controls the carrier flow is provided using a contact made outside of the plane of the figure.) The present invention differs from that of the previous disclosure in one significant way — the gate dielectric 32 has two distinct thicknesses shown by the dimensions "a" and "b" on FIG. 3. Gate dielectric thickness "a" provides low device on-resistance and high device gain in the channel region. However, this gate region extends to a depth only slightly beyond the diffused body-to-drain junction. Beyond this depth, the thickness of the gate dielectric increases as shown. This greater dielectric thickness, "b", increases the field plate induced breakdown above the limit set by "a". The breakdown voltage of a device with silicon dioxide as the gate dielectric as a function of "b" is shown in FIG. 10. The minimum breakdown voltage is shown by the dashed line on the figure.

Figure 3:
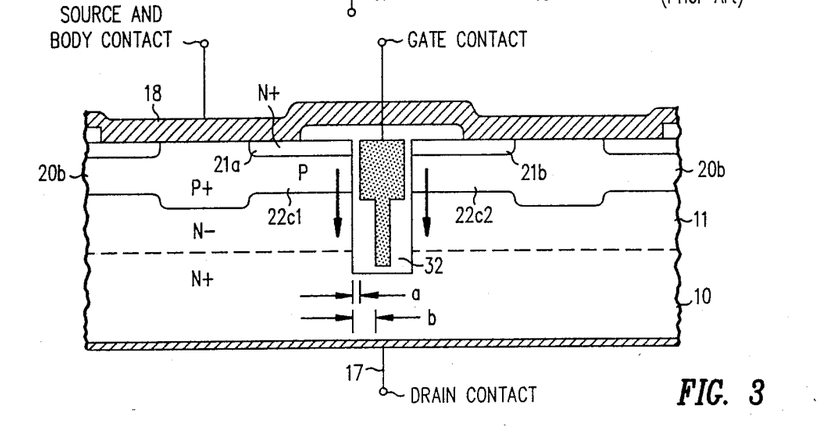
FIG. 3 shows one embodiment of the DMOS structure of the present invention.

FIG. 3 shows one embodiment of the vertical gate dense DMOS power transistor of the present invention. The process sequence for fabricating this N channel transistor is shown in FIGS. 4a–4j. In other embodiments, the vertical gate dense DMOS transistor of the present invention is a P channel device.

Figure 4A:
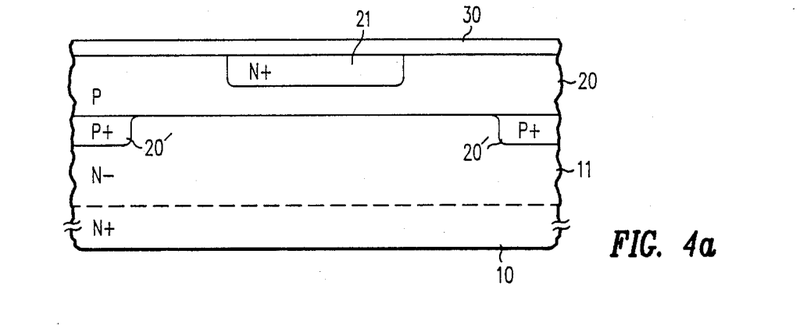
FIGS. 4a through 4j show process steps in the formation of the transistor shown in FIG. 3.

Substrate 10 shown in FIG. 4a is a silicon wafer doped with N type impurities so that its resistivity is within the range of 0.005 to 0.1 ohm-cm (in one embodiment, 0.02 ohm-cm). An N type epitaxial layer 11 having a resistivity between 0.2 and 100 ohm-cm (in one embodiment, 2.4 ohm-cm) is then grown on substrate 10 to a thickness between 6 and 150 $\mu$m (in one embodiment, 13.5 $\mu$m). Substrate 10 and epitaxial layer 11 typically have a [100] crystal orientation.

A layer of dielectric material (not shown) is then formed over the wafer by heating the wafer in an oxygen atmosphere at about 900–1200° C. to form a silicon dioxide layer approximately 1,000–10,000Å (0.1–1.0 $\mu$m) thick over the surface of the wafer. The first mask is applied using standard photolithographic techniques, and openings in the oxide are etched for the P+(deep body) regions 20'. Then using a boron implant (with a dose of $10^{14}/cm^2$ to $10^{16}/cm^2$ at 40–120 KEV) on a boron predeposition, boron is introduced into the silicon in the exposed regions. The boron is then diffused to form the P+regions 20', for instance in oxygen or nitrogen from 1–10 hours at 1000° C. to 1200° C. The P+regions are typically 3–6 $\mu$m in depth.

Using standard photoresist techniques, a body mask pattern is transferred to the surface of the silicon dioxide layer which exposes those regions of the silicon dioxide layer through which ions are implanted to form P region 20. (In one version, no body mask is needed, and a P type dopant is implanted to form region 20.) In one embodiment, P region 20 is formed by implanting boron ions at a dosage between $10^{13}$ and $2 \times 10^{14}$ ions/cm$^2$ at an energy level between 40 and 120 KEV and then diffusing the boron for approximately 4 to 12 hours in an atmosphere of oxygen or nitrogen at 900° C.–1200° C. P region 20 typically ranges in depth from 2 to 4 $\mu$m. Alternatively, P region 20 may be formed using standard diffusion techniques.

After a source mask is applied to the wafer, the wafer may then be etched to thin or remove the silicon dioxide formed during the diffusion process. (If the oxide formed after the body diffusion is not too thick, i.e., it does not block the implant, no thinning etch is needed.) An N type ion implantation is performed using arsenic or phosphorous ions at a dosage between $5 \times 10^{14}$ and $1 \times 10^{16}$ ions/cm$^2$ using an implant energy of 50 to 150 KEV. The dopant is then diffused at a temperature of 900°–1200° C. for approximately 0.5 to 3 hours in an atmosphere of oxygen and nitrogen to form N+source region 21 which typically ranges in depth from 1 to 2 $\mu$m.

The silicon dioxide layer 30 is formed during the above source drive-in. A gate "trench" or "groove" mask (not shown) is applied, and the SiO$_2$ layer is etched using buffered HF.

Figure 4B:
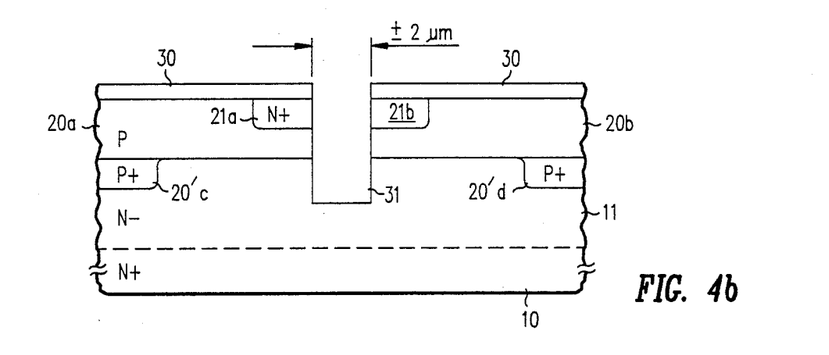

As shown in FIG. 4b, rectangular (in cross section) groove 31 having vertical sidewalls is then etched using reactive ion beam etching or other etching technique which permits anisotropic etching regardless of crystallographic orientation. Groove 31 preferably has a width less than or equal to 2 $\mu$m and a depth between 3 $\mu$m and 10 $\mu$m.

Figure 4C:
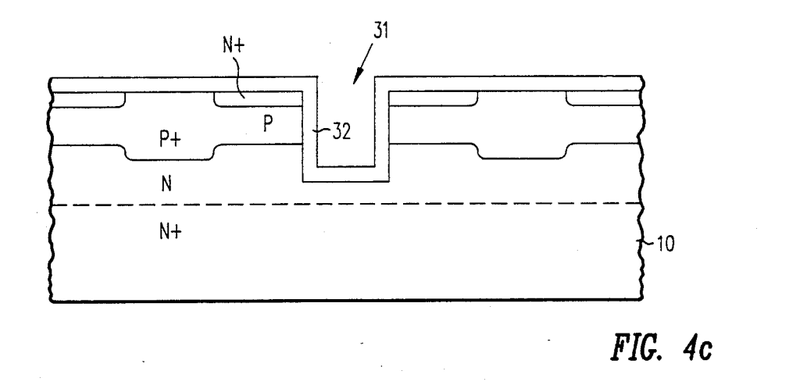

As shown in FIG. 4c, starting with the groove 31 etched in the wafer surface, the oxide layer is grown to form the gate dielectric 32 in the top portion of the groove, to a depth only slightly beyond the diffused body-to-drain junction described below.

In one embodiment, the gate dielectric upper layer is silicon dioxide having a thickness in a range of 500–1000Å and is formed by heating the wafer in an oxygen ambient containing water at a temperature of 900°–1100° C. for 0.5 to two hours (in another embodiment, insulating layer 32 is a combination of silicon dioxide and silicon nitride which is either grown or deposited). The gate dielectric forms an inner, upward opening, rectangular groove 31 having vertical sidewalls parallel to the sidewalls of groove 31.

Figure 4D:
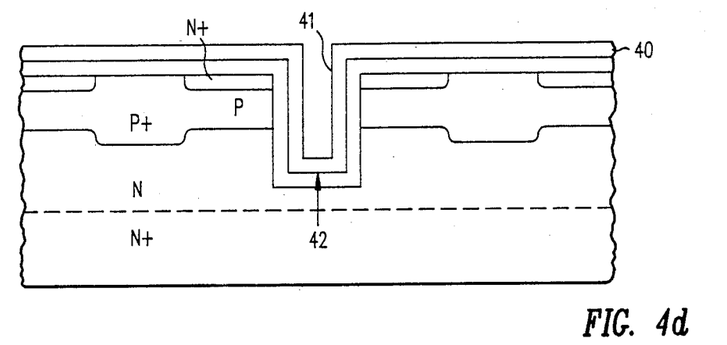

Per FIG. 4d, a layer of silicon nitride 40 is deposited on the surface of the entire wafer, including the sidewalls 41 and the bottom of the trench 42.

Figure 4E:
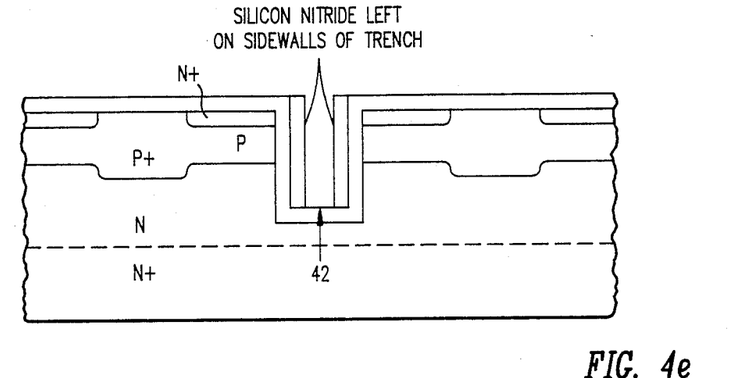
Figure 4F:
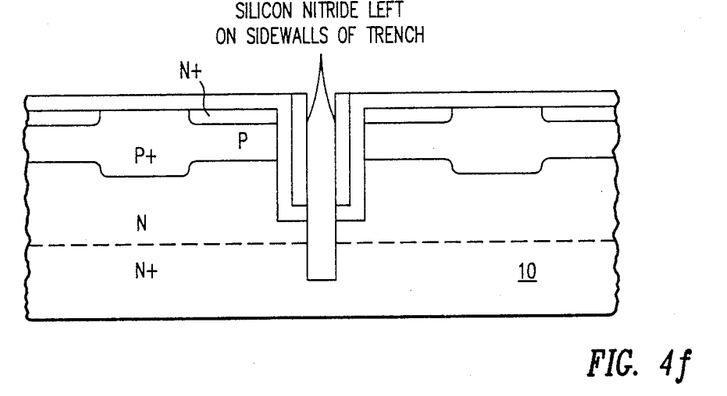

As shown in FIG. 4e, by using a directional etch technique such as RIE, the nitride and the gate dielectric are removed from the bottom 42 of the groove, while leaving them on the sides of the groove. Continuing in FIG. 4f, continue etching the groove through to the N+silicon substrate 10 by proper choice of etching technique, ambient, and conditions.

Figure 4G:
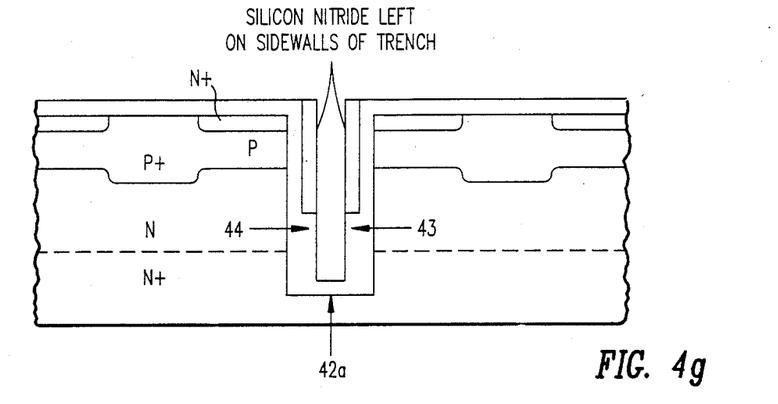

Then as in FIG. 4g, the groove is oxidized to form a thicker silicon dioxide layer 44 on the trench sidewalls 43 and bottom 42a not protected by the oxide/nitride sandwich. The additional layer is 500 to 3,000Å thick. This step provides a thicker layer of dielectric material lining the rectangular groove 31 at the depth of the groove (its lower portion) than lines the groove at its upper portion. Thus the first thicker portion of the dielectric material 44 lies in the depth of groove 31, and the second thinner portion of the dielectric material lies in the upper portion of groove 31. In the preferred embodiment, a step as shown in FIG. 4h is formed in the dielectric, when viewed in cross section, since both portions of dielectric material have vertical sidewalls.

Therefore, the sidewalls of the dielectric layer in both the upper and lower portions of groove 31 are parallel to the sidewalls of groove 31, with a step between the two portions. In the preferred embodiment, the lower thicker portion of the dielectric is 1,000 to 4,000Å thick. The upper thinner portion is 500 to 1,000Å thick. The lower portion is at least 500Å thicker than the upper portion in the preferred embodiment.

Figure 4H:
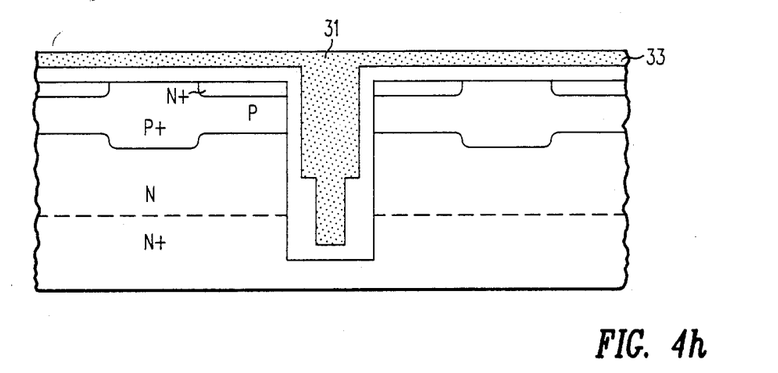

Next in FIG. 4h, polycrystalline silicon 33 is deposited to form the gate conductor. The nitride may be left on, or removed from the upper portion of the groove sidewalls 43.

Polysilicon layer 33 (shown in FIG. 4h) is deposited using a low pressure chemical vapor deposition process (LPCVD) to a thickness sufficient to fill rectangular groove 31. For example, if groove 31* is 1.5 µm wide and 6 µm deep, polycrystalline silicon layer 33 is deposited with a thickness of 1-2 µm. Polycrystalline silicon layer 33 is doped either during deposition or subsequent to deposition, typically using phosphorus, so that it has a sheet resistance of between 30 and 50 ohms/square. Alternatively, in another embodiment, layer 33 comprises a layer of silicide formed using conventional techniques to a depth sufficient to fill groove 31.

Figure 4I:
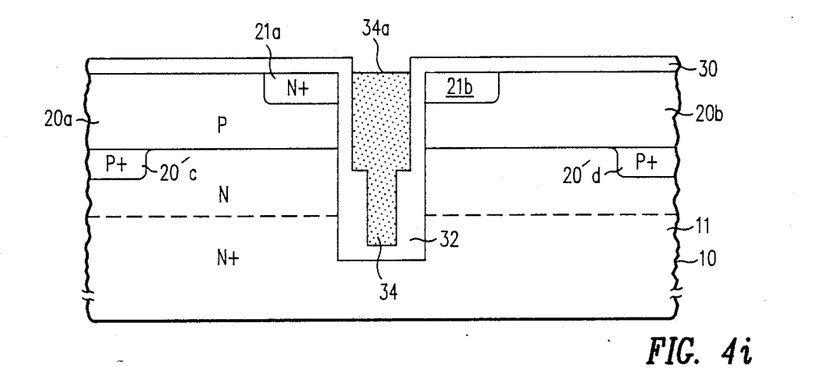

Polycrystalline silicon layer 33 is then subjected to a $CF_4$ etch or another etch technique without using a mask in the grooved area, groove 31, (except for a mask (not shown) which may be placed at any convenient point along the length of groove 31 in order to keep a contact pad (not shown) to the to-be-formed gate 34 shown in FIG. 4i) in order to remove the polycrystalline silicon not in groove 31. The portion of polycrystalline silicon layer 33 remaining in groove 31 after the $CF_4$ etch is denoted by 34 in FIG. 4i and serves as the gate of the vertical DMOS transistor. The etch is continued until top surface 34a lies 0.25-0.5 µm below the top surface of layer 30. This top surface depth is controlled by etch time past clearing the field. The etch must be terminated so that gate 34 overlaps N+regions 21a and 21b shown in FIG. 4j after the subsequent oxidizing step. The wafer is then oxidized in an atmosphere containing oxygen (which consumes a portion of polysilicon layer 33 in groove 31) until the top surface of the oxidized portion 35 above gate 34 forms an essentially flat (planar) surface with the top surface of passivating layer 30 whose thickness may also be slightly increased during the formation of region 35. Of importance, the etch to form surface 34a must be terminated sufficiently soon so that after the oxidation which forms silicon dioxide layer 35, the top portion of gate 34 overlaps N+source regions 21a and 21b (see FIG. 4j).

The above structure has a flat surface for all masking steps while still allowing contact to be made to the gate region. The source/body contact shown schematically in FIG. 3 is fabricated using prior art techniques, and in cross section typically appears as shown in FIG. 1.

When the gate-to-source potential is sufficiently high and with a positive potential on drain 17 (FIG. 3), electrons flow vertically from N+source regions 21a and 21b through channel regions 22c1 and 22c2 in body regions 20a and 20b, respectively, and continue to flow vertically downward through drain 11 and N+substrate (drain) 10 of drain contact 17.

Figure 9A:
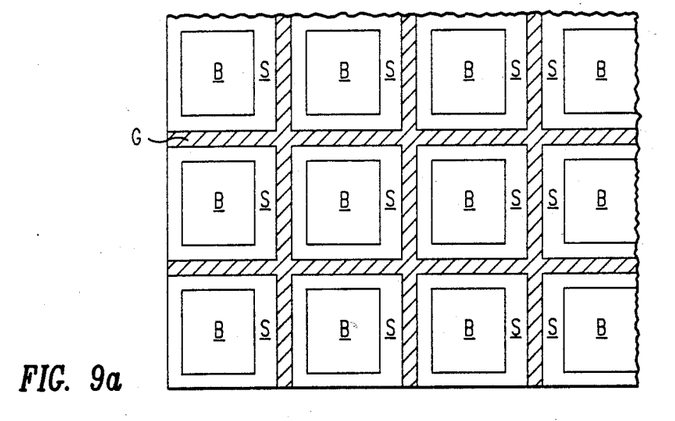
Figure 9B:
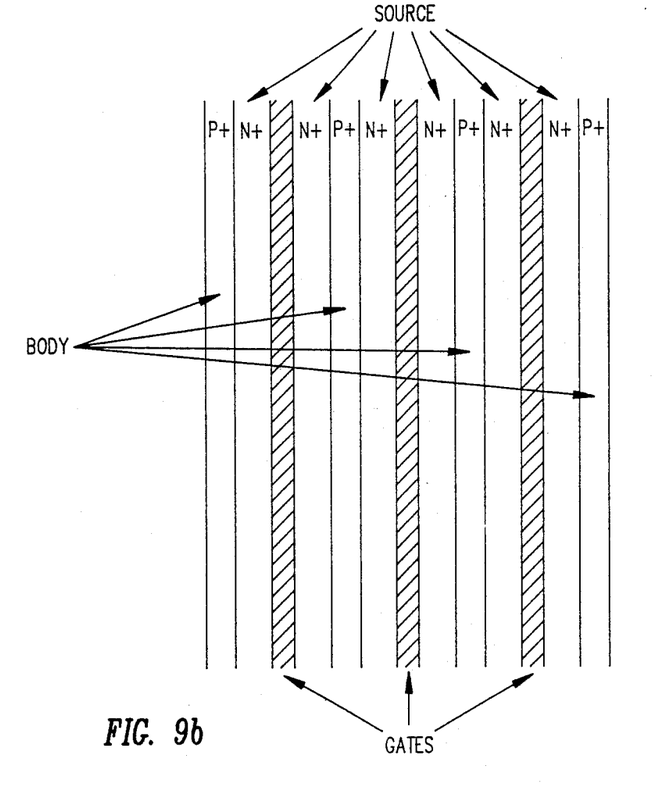
FIG. 9b shows a top view of a second surface geometry.

Typically, many DMOS devices similar to the one shown in cross section in FIG. 3 are formed simultaneously. Layout efficiency varies with surface geometry. There are a wide variety of layouts. FIG. 9a shows a top view of one surface geometry employed by this invention, namely, a square source and body region on a square gate grid. In FIG. 9a, S denotes the locations of the source regions, B the locations of the body regions, and G the locations of the gate regions. In the layout shown in FIG. 9b, the gate and source and body regions are interdigitated. Another layout (not shown) has hexagonal source and body regions on a hexagonal gate grid. Still another layout employs square source and body regions on a hexagonal gate grid. Other source geometries include rectangles, circles and triangles.

The structure shown in FIG. 3 reduces the total area requirement to 30% to 50% below that of the device of Ueda shown in FIG. 2.

Figure 4J:
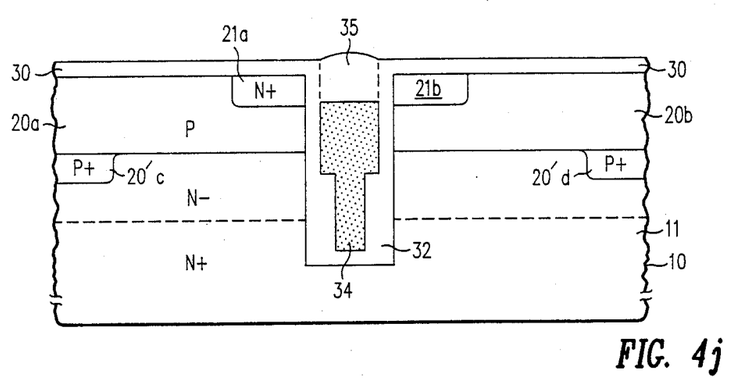
Figure 5:
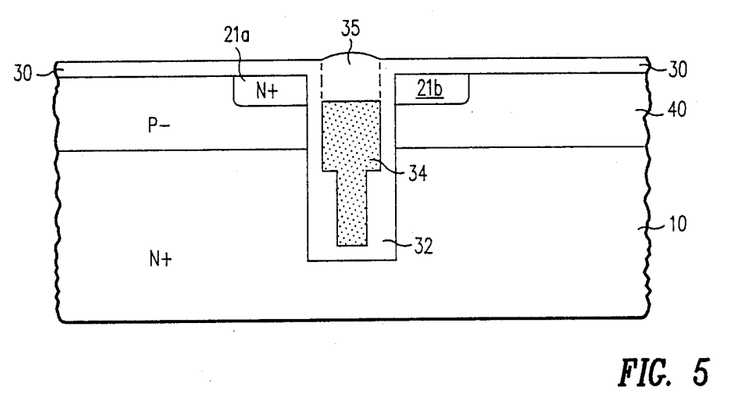
FIG. 5 shows a second embodiment of the DMOS transistor of the present invention.

FIG. 5 shows a cross section of an alternate embodiment of the invention in which a P−epitaxial layer 40 is formed on substrate 10 in place of N−epitaxial layer 11 and in which gate 34 in groove 31 reaches through to the N+substrate. In this embodiment the P−epitaxial layer serves as the body region of the transistor. This embodiment results in a transistor having a lower on resistance than the device shown in FIG. 4j by as much as a factor of 2 and a lower breakdown voltage (typically around 30 volts) than the device shown in FIG. 4j.

Figure 6:
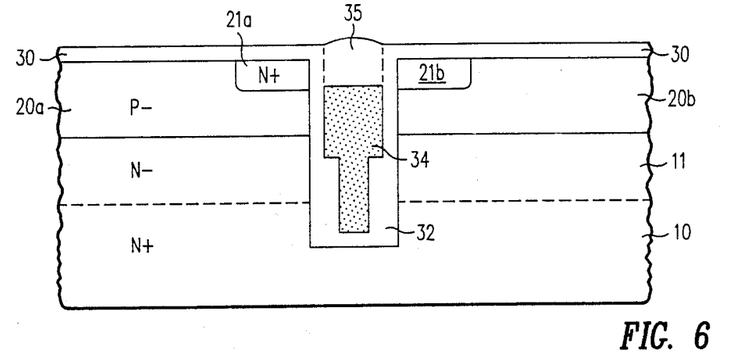
FIG. 6 shows a third embodiment of the DMOS transistor of the present invention.

FIG. 6 shows another alternate embodiment of the invention which is similar to the embodiment shown in FIG. 4j except that groove 31 is not formed sufficiently deep so that gate 34 extends completely through the epitaxial layer 11 and into substrate region 10. This alternate embodiment also has a higher on-resistance and a higher breakdown voltage than the device shown in FIG. 4j.

The above description has been given in terms of DMOS transistors, but the invention also applies to other MOS-gated devices such as a MOS-gated SCR or a MOS-gated conductivity modulated device.

Figure 7:
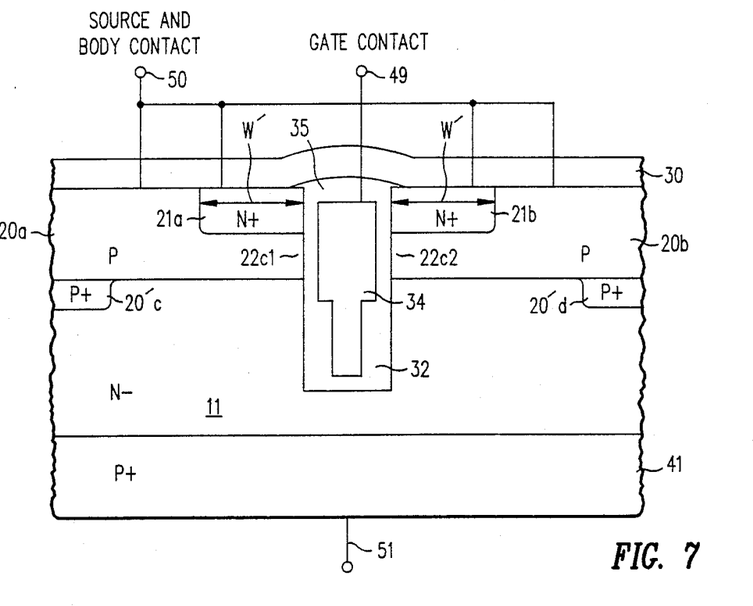
FIG. 7 shows a cross section of an insulated gate bipolar transistor formed according to the present invention.
Figure 8:
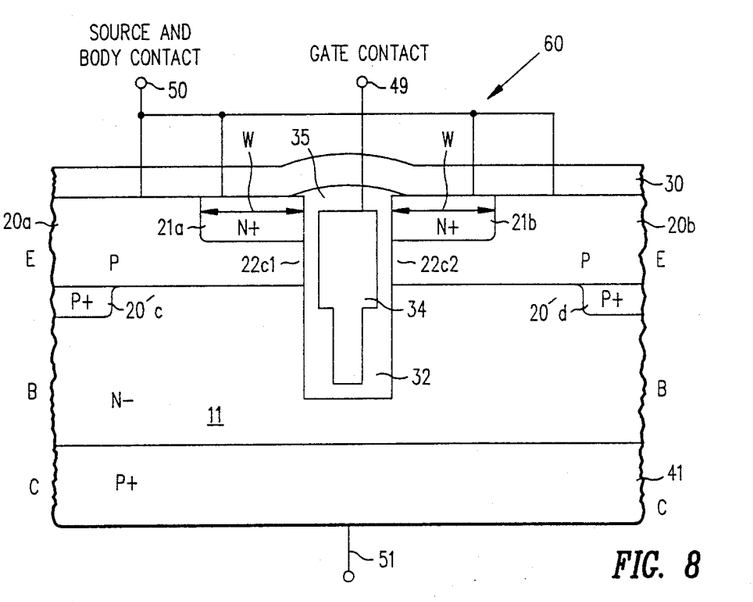
FIG. 8 shows a cross section of a MOS-gated silicon controlled rectifier formed according to the present invention.

FIG. 7 shows a cross section of one embodiment for an insulated gate bipolar transistor. FIG. 8 shows a cross section of one embodiment for a MOS-gated silicon controlled rectifier.

The insulated gate bipolar transistor shown in FIG. 7 is fabricated in the same manner as explained above for the transistor shown in FIG. 3 in connection with FIGS. 4a through 4j except that the starting material is a silicon substrate 41 heavily doped with P type material, for example doped with boron to a resistivity of 0.01 ohm-cm.

The MOS-gated silicon controlled rectifier of FIG. 7 is fabricated with the same P+substrate. In operation, the silicon controlled rectifier is switched on by appropriately biasing source/body terminal 50 (shown schematically in FIG. 8), which provides electrical contact to source regions 21a and 21b and body regions 20a and 20b, gate terminal 49, which contacts gate 34, and substrate contact 51. Gate contact 49 and substrate contact 51 are biased positive relative to source/body contact 50. MOSFET mode conduction is initiated by electrons flowing from source regions 21a and 21b through channel regions 22c1 and 22c2, respectively, to N- drain region 11.

Drain region 11 also serves as the base for the PNP bipolar (junction) transistors comprising emitter region 20a, base 11, and collector region 41; and emitter region 20b, base 11, and collector region 41, respectively. With substrate contact 51 biased positively with respect to source/body contact 50 and with electrons flowing into base 11, the junction transistors are triggered into conduction and remain latched in the on-state even when the gate bias is removed.

The insulated gate transistor shown in FIG. 7 is similar to the structure shown in FIG. 8 except that in order to suppress thyristor action, the IGT shown in FIG. 7 is designed with narrow N+source regions 21a and 21b which reduce the lateral body resistance beneath the source regions. See *The Insulated Gate Transistor: A New Three-Terminal MOS-Controlled Bipolar Power Device*, IEEE Trans. on Electron Devices, Vol. ED-31 No. 6, June 1984, which is incorporated herein by reference. For example, the width w' of N+source regions 21a and 21b in FIG. 7 is typically between 1 $\mu$m and 3 $\mu$m whereas the width w of N+source regions 21a and 21b in FIG. 8 is typically between 6 $\mu$m and 8 $\mu$m. The doping profile of the body regions beneath source regions 21a and 21b in FIG. 7 is also selected to reduce lateral body resistance beneath source regions 21a and 21b. See Blanchard, U.S. Pat. No. 4,345,265, issued Aug. 17, 1982, which is incorporated herein by reference. A low lateral body resistance beneath source regions 21a and 21b in FIG. 7 prevents the NPN transistor formed by source regions 21a and 21b, body regions 22c1 and 22c2, and the N type drain region 11 from becoming active. As long as this NPN bipolar transistor does not turn on, the regenerative action characteristic of an SCR does not occur.

The above embodiments are meant to be exemplary and not limiting. In view of the above disclosure, many modifications and substitutions will be obvious to one of average skill in the art without departing from the scope of the invention.

DISCLOSURE

The following references are disclosed. Each was cited in the application Ser. No. 06/843,454, issued a U.S. Pat. No. 4,761,122 on Aug. 30, 1988 and they are made of record in the present disclosure as well:
U.S. Pat. No. 4,520,552 issued to Arnould et al.
U.S. Pat. No. 4,364,074 issued to Garnache et al.
U.S. Pat. No. 4,353,086 issued to Jaccodine et al.
U.S. Pat. No. 3,500,139 issued to Frouin et al.
U.S. Pat. No. 4,528,047 issued to Beyer et al.
U.S. Pat. No. 4,571,815 issued to Baliga et al.
U.S. Pat. No. 3,412,297 issued to Amlinger.
U.S. Pat. No. 4,631,803 issued to Hunter et al.
U.S. Pat. No. 3,518,509 issued to Cullis et al.
U.S. Pat. No. 4,546,367 issued to Schutten et al.
U.S. Pat. No. 4,374,455 issued to Goodman.
U.S. Pat. No. 4,509,249 issued to Goto et al.
U.S. Pat. No. 4,582,565 issued to Kawakatsu.
European patent application No. 85106857.7 (publication No. 0164095).
Japanese laid-open publication 58-3287 based on a Japanese patent application by Furumura.
Japanese laid-open publication 58-50752 based on an application filed by Fukuyama.
U.S. Pat. No. 4,454,646 issued to Joy et al.
U.S. Pat. No. 4,454,647 issued to Joy et al.
Japanese publication No. 65447 based on an application filed by Kazuya, dated 4/84.
The article "MOS Thyristor Improves Power-Switching Circuits" by Pshaenich, Electronics Design, May 12, 1983, pp. 165–170.

In addition, the following references are relevant per application Serial No. 06/929,685 and they are made of record in the present disclosure as well:
U.S. Pat. No. 4,344,081 issued to Pao et al.
U.S. Pat. No. 4,345,265 issued to Blanchard.
U.S. Pat. No. 4,455,740 issued to Iwai.
U.S. Pat. No. 4,398,339 issued to Blanchard et al.
U.S. Pat. No. 4,639,754 issued to Wheatley, Jr. et al.
Japan Pat. No. 0,097,442 issued to Schuhen.
Japan Pat. No. 53,149,771 issued to Matsushita.
Japan Pat. No. 55,146,976 issued to Hideschimi.
Baliga et al., "The Insulated Gate Transistor: A New Three-Terminal MOS-Controlled Bipolar Power Device", *IEEE Transactions on Electron Devices*, Vol. ED-31, No. 6, June 1984, pp. 821–828.
Ueda, "A New Vertical Power MOSFET Structure with Extremely Reduced On-Resistance", *IEEE Transactions on Electron Devices*, Vol. ED-32, No. 1, Jan. 1985, pp. 2–6.

I claim:

1. A method of making a semiconductor device comprising the steps of:
   providing a first region of semiconductor material having a first conductivity type;
   forming a second region of semiconductor material having a second conductivity type, overlying said first region;
   forming a first groove, said first groove extending through said second and third regions and into said first region so that a first portion of said third region and a first portion of said second region lie on at least one side of said first groove;
   lining said first groove with a dielectric material thereby forming a second, inner groove, having a first portion of said dielectric material of a predetermined thickness on a sidewall of said first groove thicker than a second portion thereof of a predetermined thickness on said sidewall of said first groove, with the first portion thereof closer to the depth of the first groove than the second portion thereof;
   filling the depth of said second, inner groove with a conductive material; and
   forming an insulating layer over the device resulting from the preceding steps.

2. The method of claim 1 further comprising the steps of:
   forming a mask on a first portion of said conductive material in said second, inner groove, a second portion of said conductive material not being covered by said mask;

remaining part of said second portion of said conductive material, the remaining conductive material in said second, inner groove serving as a gate; and forming an electrically conductive layer for electrically contacting said first portion of said conductive material.

3. The method of claim 1 further comprising the step of removing a portion of said conductive material in said second, inner groove so that a top portion of said second, inner groove adjacent to said dielectric material is not filled with semiconductive material, said step of forming an insulating layer comprising the step of forming insulating material in said top portion of said second, inner groove.

4. The method of claim 10 wherein said step of filling the bottom portion comprises the steps of forming said conductive material in said second, inner groove and on the surface of said third region and then etching said conductive material so that said conductive material on the surface of said third region adjacent to said second, inner groove is removed.

5. The method of claim 1 wherein said step of filling the bottom portion comprises the step of forming said conductive material in said second inner groove and etching a portion of said conductive material in said second, inner groove.

6. The method of claim 1, wherein said first groove is formed so as to be rectangular in cross section, and said second groove is formed so that the sidewalls of said second groove are parallel to the sidewalls of said first groove.

7. The method of claim 1, wherein said first portion of said dielectric material has a thickness at least 500Å greater than the thickness of said second portion of said dielectric material.

8. Method of claim 1, wherein at each step the structure with the exception of the first and second grooves has a flat surface for the carrying out of the succeeding step.

9. A method of making a semiconductor device comprising the steps of:

providing a first region of semiconductor material having a first conductivity type;

forming a second region of semiconductor material having a second conductivity type, opposite the first conductivity type, overlying said first region;

forming a third region of said first conductivity type overlying a portion of said second region;

forming a first groove having sidewalls and a bottom, said first groove extending through said second and third regions so that a first portion of said third region and a first portion of said second region lie n at least one side of said first groove;

lining said first groove with a dielectric material having a uniform thickness on said sidewalls of said first groove;

forming a second groove having a sidewalls extending through the bottom of said first groove, said second groove extending into said first region;

lining said second groove with a dielectric material having a uniform thickness on the sidewalls of said second groove;

whereby said dielectric material on said sidewalls of said second groove is thicker than said dielectric material on said sidewalls of said first groove;

filling said first and second grooves with a conductive material; and forming an insulating layer over the device resulting from the preceding steps;

and wherein at each step the structure with the exception of the first and second grooves has a flat surface for carrying out of the succeeding step.

* * * * *

UNITED STATES PATENT AND TRADEMARK OFFICE
CERTIFICATE OF CORRECTION

PATENT NO. : 4,914,058
DATED : April 3, 1990
INVENTOR(S) : Richard A. Blanchard

It is certified that error appears in the above-identified patent and that said Letters Patent is hereby corrected as shown below:

Col. 1, line 41, change "regionS" to --regions--.

Col. 5, line 40, change "31*" to --31--.

Col. 7, line 59, change "4,761,122" to --4,761,722--.

Col. 8, line 21, after "06/929,685" insert --now abandoned--.

Col. 8, after line 46, <u>Claim 1</u>, insert --forming a third region of said first conductivity type overlying a portion of said second region;--.

Col. 9, line 35, <u>Claim 7</u>, change "Claim 1" to -- Claim 6--.

Col. 10, line 18, <u>Claim 9</u>, change "n" to --on--.

Signed and Sealed this

Twenty-third Day of June, 1992

Attest:

DOUGLAS B. COMER

*Attesting Officer*    *Acting Commissioner of Patents and Trademarks*